US011855610B1

(12) United States Patent
Sampat et al.

(10) Patent No.: US 11,855,610 B1
(45) Date of Patent: Dec. 26, 2023

(54) BROADBAND DATA MULTIPLEXER

(71) Applicant: Rockwell Collins, Inc., Cedar Rapids, IA (US)

(72) Inventors: Hiren Sampat, Mckinney, TX (US); Ian P. Difranco, Richardson, TX (US); Todd Edwards, Frisco, TX (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 493 days.

(21) Appl. No.: 17/005,001

(22) Filed: Aug. 27, 2020

(51) Int. Cl.
*H03J 5/24* (2006.01)
*H01P 1/213* (2006.01)

(52) U.S. Cl.
CPC ............. *H03J 5/244* (2013.01); *H01P 1/213* (2013.01)

(58) Field of Classification Search
None
See application file for complete search history.

(56) References Cited

U.S. PATENT DOCUMENTS

| | | | |
|---|---|---|---|
| 3,757,139 A | 9/1973 | Hunter | |
| 3,772,757 A * | 11/1973 | Goldstein | B23Q 7/10 29/790 |
| 4,137,850 A * | 2/1979 | Donner | F42C 11/00 102/215 |
| 4,616,178 A * | 10/1986 | Thornton, Jr. | G01R 31/2851 324/754.03 |
| 4,675,905 A | 6/1987 | Flora et al. | |
| 5,218,196 A * | 6/1993 | Dogul | H01H 47/002 250/221 |
| 5,252,962 A * | 10/1993 | Urbas | A61B 5/0008 374/E1.004 |
| 5,381,076 A * | 1/1995 | Nerone | H05B 41/388 315/307 |
| 5,483,436 A * | 1/1996 | Brown | B60L 50/51 323/269 |
| 5,577,044 A | 11/1996 | Oxford | |
| 5,928,300 A * | 7/1999 | Rogers | B60R 21/0132 340/436 |
| 5,933,339 A * | 8/1999 | Duba | H02P 27/16 363/71 |

(Continued)

FOREIGN PATENT DOCUMENTS

| | | |
|---|---|---|
| CN | 104469180 A | 3/2015 |
| DE | 3613475 A1 | 1/1987 |

(Continued)

OTHER PUBLICATIONS

Mahidharia, Anool, "Escape Cable Hell with an Audio I/O Multiplexer", Hackaday, Nov. 2, 2015, https://hackaday.com/2015/11/02/escape-cable-hell-with-a-multi-io-audio-multiplexer/, 3 pages.

(Continued)

*Primary Examiner* — Christopher T Wyllie
(74) *Attorney, Agent, or Firm* — Suiter Swantz pc llo

(57) ABSTRACT

A broadband switch includes multi-stage electromechanical ganged stage relays. The ganged stage relays provide at least 65 dB of electrical isolation from active broadband input or active broadband output to all non-active broadband inputs. In a further aspect, the ganged stage relays provide at least 100 dB of electrical isolation from 1 kHz to 100 MHz from broadband inputs and broadband output to power inputs.

13 Claims, 5 Drawing Sheets

(56) References Cited

U.S. PATENT DOCUMENTS

| | | | |
|---|---|---|---|
| 5,946,301 A * | 8/1999 | Swanson | H04L 43/50 |
| | | | 370/252 |
| 5,978,881 A | 11/1999 | Lebhar | |
| 6,093,888 A * | 7/2000 | Laureanti | H05K 9/0037 |
| | | | 257/725 |
| 6,828,845 B2 | 12/2004 | Pennock et al. | |
| 9,247,157 B2 | 1/2016 | Choi et al. | |
| 2002/0011891 A1 | 1/2002 | Schuurmans et al. | |
| 2002/0060624 A1 * | 5/2002 | Zhang | H04B 3/542 |
| | | | 340/310.18 |
| 2006/0007614 A1 * | 1/2006 | Pozzuoli | H02M 3/335 |
| | | | 361/62 |
| 2009/0115509 A1 * | 5/2009 | Minteer | H03F 3/68 |
| | | | 330/195 |
| 2009/0191911 A1 * | 7/2009 | Wilson | H04M 1/72403 |
| | | | 455/556.1 |
| 2010/0295383 A1 * | 11/2010 | Cummings | H02J 1/102 |
| | | | 307/151 |
| 2011/0103618 A1 | 5/2011 | Emellat et al. | |
| 2013/0248659 A1 * | 9/2013 | Lingvall | B61L 29/28 |
| | | | 246/126 |
| 2013/0293997 A1 * | 11/2013 | Tollefsbol | H02H 9/005 |
| | | | 361/111 |
| 2014/0334640 A1 * | 11/2014 | Chan | G06F 1/266 |
| | | | 381/98 |
| 2015/0229288 A1 * | 8/2015 | Kisner | H03H 7/0115 |
| | | | 333/168 |
| 2016/0057824 A1 * | 2/2016 | Hu | H05B 45/38 |
| | | | 315/210 |
| 2019/0144242 A1 * | 5/2019 | Shijo | H02J 50/12 |
| | | | 187/393 |
| 2020/0205224 A1 * | 6/2020 | Lee | H04W 28/065 |
| 2021/0022276 A1 * | 1/2021 | Embleton | H05K 7/1492 |
| 2021/0075410 A1 * | 3/2021 | Takaya | H01L 23/522 |
| 2021/0257927 A1 * | 8/2021 | Zhou | H03K 17/691 |
| 2021/0328519 A1 * | 10/2021 | Fabbro | H03K 17/691 |
| 2021/0399624 A1 * | 12/2021 | Brown | H02J 7/02 |
| 2022/0107394 A1 * | 4/2022 | Li | G01S 7/4863 |

FOREIGN PATENT DOCUMENTS

| | | |
|---|---|---|
| DE | 10162751 A1 | 7/2003 |
| EP | 0447347 A1 | 9/1991 |
| WO | 1991015920 A1 | 10/1991 |
| WO | 1993014581 A1 | 7/1993 |
| WO | 2001078270 A3 | 7/2002 |

OTHER PUBLICATIONS

Signore, T. L. et al., "The Aeronautical Telecommunication Network (ATN)", IEEE, 1998, 5 pages.

Snell Advanced Media, "The most comprehensive range of infrastructure for your broadcast or media business", Catalog, Downloaded Jun. 28, 2020, pp. 227-265, http://sktg.co.kr/wp-content/uploads/2016/06/sam_iq_catalog_jan_2016.pdf.

* cited by examiner

BROADBAND DATA MULTIPLEXER

BACKGROUND

Military platforms especially military service aircraft, shipboard systems, and ground systems have multiple systems where data is generated and has to be multiplexed and switched into or out of a radio. Depending on the mission, clients may be read-in at different levels and that may require broadband data isolation (including at audio frequencies) from one system to another. Existing solutions use semiconductor-based switches that do not provide sufficient isolation due to non-linear nature of semiconductor devices, inherent proximity of signals due to sharing the same substrate of semiconductor device and the limitations due to miniaturization of semiconductors. Broadband data (including at audio frequencies) signals can be extracted with very little or minimal effort due to the limitations arising from the use of semiconductor devices as delineated above, hence the isolation requirements are high, on the order of 60+dB for channel-to-channel and 100 dB for active channel to power source. Existing solutions cannot currently achieve the required isolation; and electromagnetic isolation is problematic below about 100 MHz.

There is a need for a broadband multiplexer switch. The switch must provide electrical Isolation from various Inputs to the power source of 100 dB from 1 kHz to 100 MHz. The switch is also required to provide mutual electrical Isolation from one Input to another Input/output of 65 dB from 1 kHz to 100 MHz.

SUMMARY

In one aspect, embodiments of the inventive concepts disclosed herein are directed to a broadband switch with multi-stage electromechanical ganged stage relays. The ganged stage relays provide at least 65 dB of electrical isolation from 1 kHz to 100 MHz from active broadband input or active broadband output to all non-active broadband inputs. In a further aspect, the ganged stage relays provide at least 100 dB of electrical isolation from 1 kHz to 100 MHz from broadband inputs and broadband output to power inputs. In a further aspect, the ganged stage relays are RF relays that provide isolation up to 100 MHz.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Figure 1:
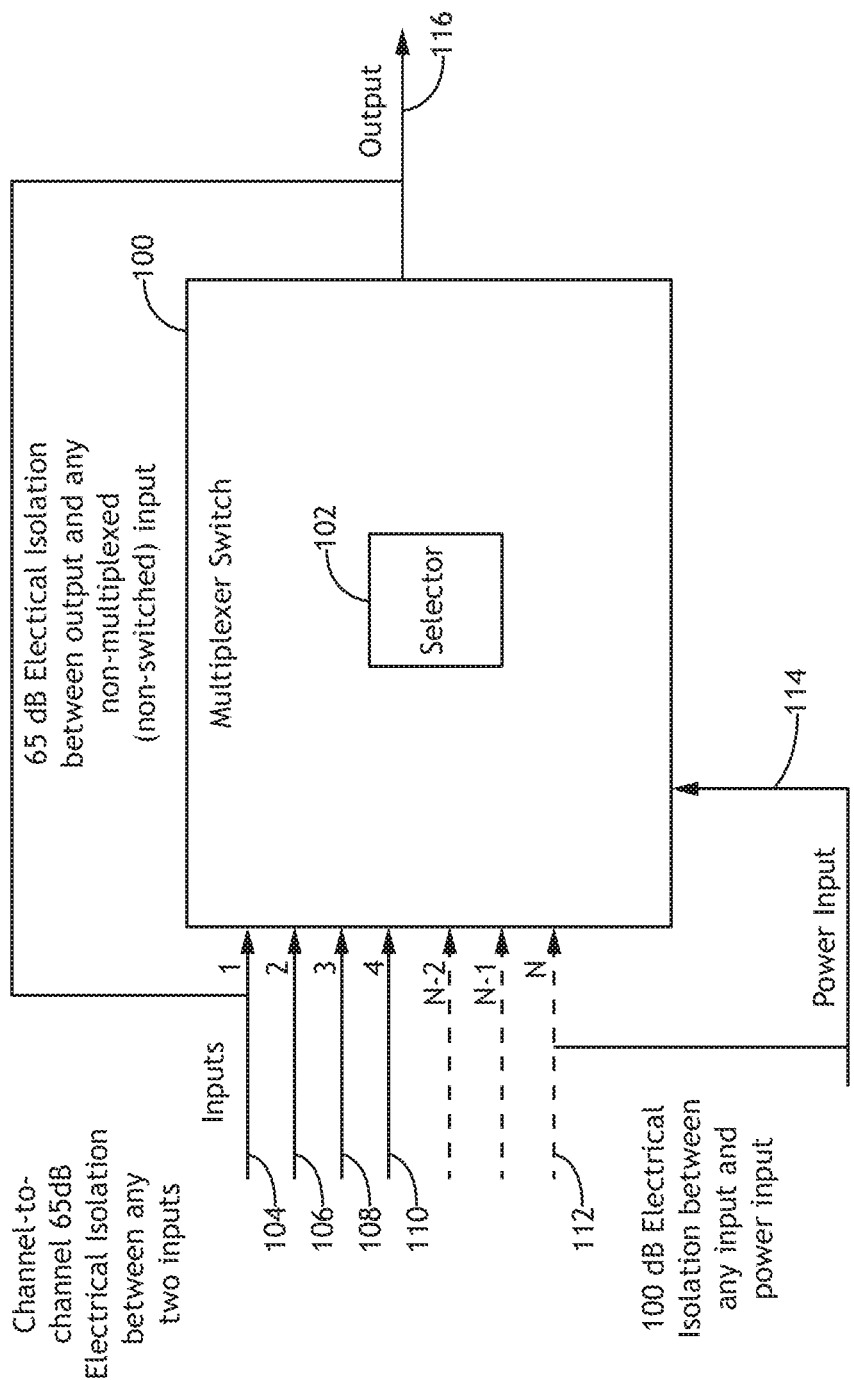
FIG. 1 shows a block diagram of a broadband multiplexer according to an exemplary embodiment.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a broadband switch with multi-stage electromechanical ganged stage relays. The ganged stage relays provide at least 65 dB of electrical isolation from 1 kHz to 100 MHz from any non-active broadband input to a broadband output. In a further aspect, the ganged stage relays provide at least 100 dB of electrical isolation from 1 kHz to 100 MHz from broadband inputs to power inputs. In a further aspect, the ganged stage relays are RF relays that provide isolation up to 100 MHz.

Referring to FIG. 1, a block diagram of a broadband multiplexer 100 according to an exemplary embodiment is shown. The broadband multiplexer 100 comprises a plurality of inputs 104, 106, 108, 110, 112 and an input selector 102 for selecting an input 104, 106, 108, 110, 112 to direct broadband signals to an output 116. Each of the inputs 104, 106, 108, 110, 112 is electrically isolated from each of the other inputs 104, 106, 108, 110, 112. In at least one embodiment, the electrical isolation between the inputs 104, 106, 108, 110, 112 is at least 65 dB. Furthermore, each of the inputs 104, 106, 108, 110, 112 is electrically isolated from the output 116. In at least one embodiment, the electrical isolation between the inputs 104, 106, 108, 110, 112 and the output 114 is at least 65 dB.

In at least one embodiment, the broadband multiplexer 100 is fed via a power input 114. The power input 114 is electrically isolated from each of the inputs 104, 106, 108, 110, 112 and the output 114 by at least 100 dB.

Figure 2:
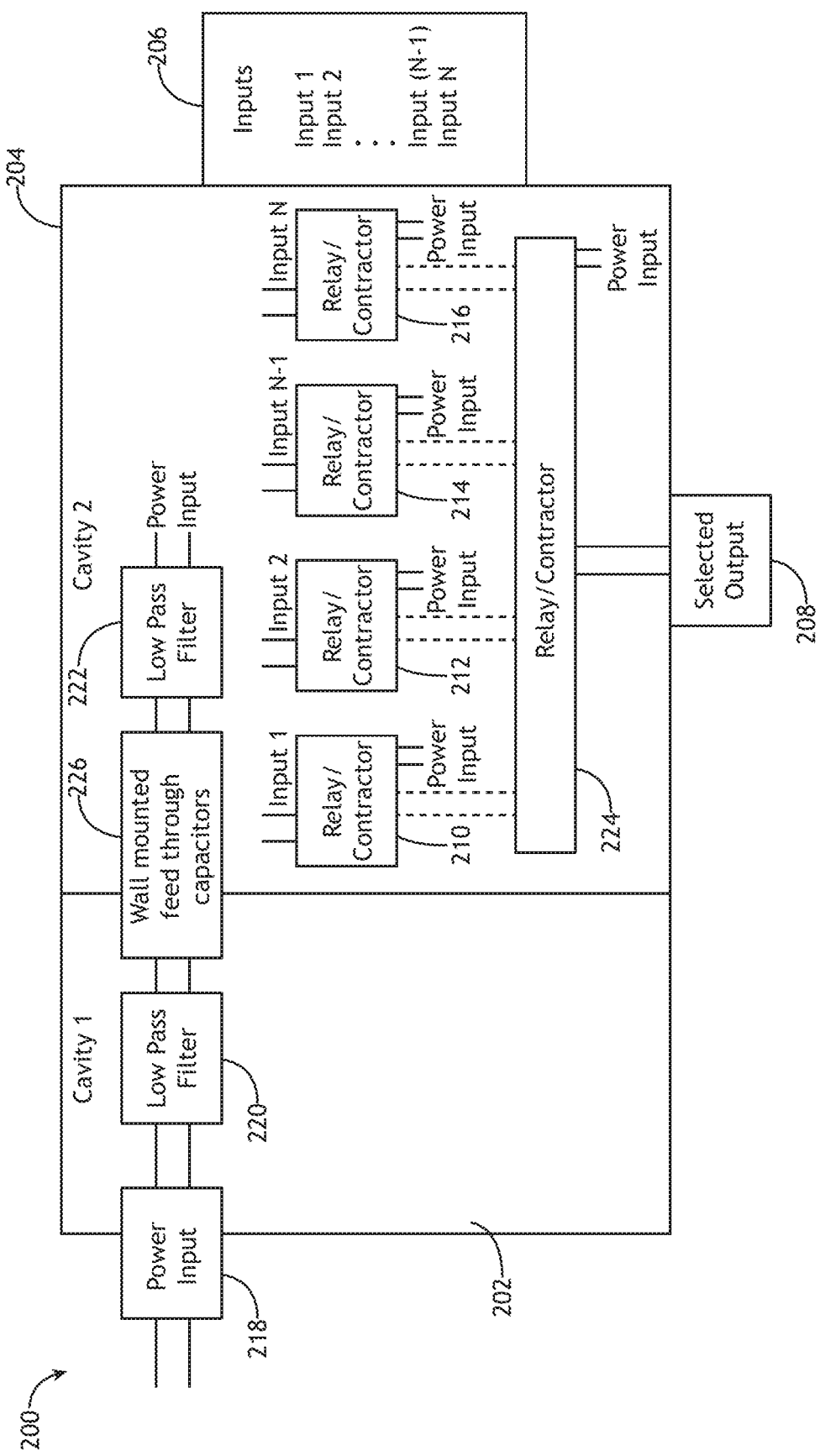
FIG. 2 shows a block diagram of a broadband multiplexer switch according to an exemplary embodiment.

Referring to FIG. 2, a block diagram of a broadband multiplexer switch 200 according to an exemplary embodiment is shown. The multiplexer switch 200 comprises a first electromagnetically isolated cavity 202 and a second electromagnetically isolated cavity 204. Power interface lines from a power input 218 cross the first electromagnetically isolated cavity 202 into the second electromagnetically isolated cavity 204. In at least one embodiment, the power interface lines are filtered through low-pass filters 220, 222, each disposed in one of the electromagnetically isolated cavities 202, 204. In at least one embodiment, the power interface lines are filtered via one or more feedthrough capacitors 226 which may be disposed between the low-pass filters 220, 222. In at least one embodiment, routing the power interface lines orthogonal to data input lines provides at least 100 dB of electrical isolation. The feed-through capacitors 226 may provide 15 dB of attenuation above 30 kHz, over and above the isolation provided by low-pass filters 220, 222 for a total 115 dB of isolation. The feed-through capacitors 226 breach DC power from the first electromagnetically isolated cavity 202 to the second electromagnetically isolated cavity 204. Any feed-through wall-mounted LC, or Pi filter combination with acceptable insertion loss may be used.

In at least one embodiment, a set of inputs 206 is in data communication with corresponding relays 210, 212, 214, 216. Each of the relays 210, 212, 214, 216 is fed via the power input 218 (and potentially the corresponding low-pass filters 220, 222 and feedthrough capacitors 226).

In at least one embodiment, the multiplexer switch 200 lacks any common ground to prevent ground loop. Furthermore, there is no shared plane (return lines) to lower mutual inductance. In at least one embodiment, the power inputs 212 are shielded and the power return is treated as a signal pin rather than a common ground.

Figure 3:
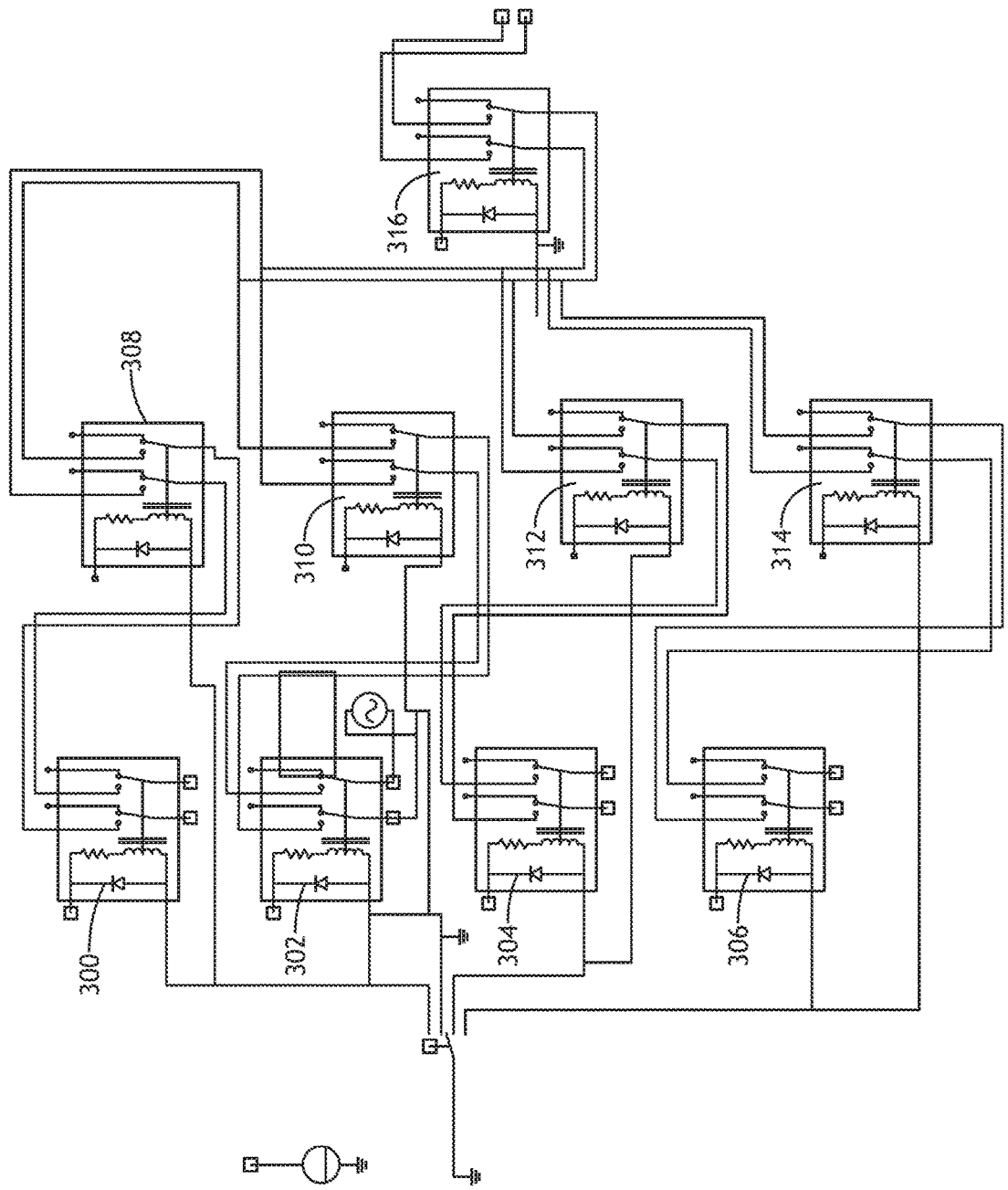
FIG. 3 shows a circuit diagram of a ganged stage relays according to an exemplary embodiment.

Referring to FIG. 3, a circuit diagram of a ganged stage relays 300, 302, 304, 306, 308, 310, 312, 314, 316 according to an exemplary embodiment is shown. Switching may be via analog passive means like electromechanical relays 300, 302, 304, 306, 308, 310, 312, 314, 316 which are passive except for coils that need power to switch, contactors, or other such passive components rather than using digital/electronic switches or solid-state switches. Digital electronics are undesirable because they have inherent active non-linear parts that generate harmonics, spurs, and undesired mixing products that lowers electrical isolation. Furthermore, digital switches or solid-state switches are usually installed on PWBs, making them less desirable to achieve 65 dB of isolation from 1 kHz to 100 MHz. Electromechanical relays may be chosen such that they do not have diodes on the coil, which prevent back-EMF-kickback-voltage of the coil from damaging electronics; that function may be implemented in a first electromagnetically isolated cavity by using a diode in the first electromagnetically isolated cavity instead of the second electromagnetically isolated. Alternatively, in at least one embodiment, use of high voltage capacitors in relation to bleeder resistors could be implemented on the coil input to prevent damage from back-EMF-kickback-voltage of the coil from damaging other coils. The implementation will be iteratively chosen to optimize design complexity and cost versus meeting isolation requirement.

In at least one embodiment, the electro-mechanical ganged stage relays 300, 302, 304, 306, 308, 310, 312, 314, 316 are two, three, or more stages deep to achieve the required isolation of 65 dB from 1 kHz to 100 MHz.

Signals may be routed with twisted shielded pairs with a return isolated from the shield, and the shield grounded at one end. In at least one embodiment, if the twisted shielded pairs intersect, they may be oriented orthogonally.

In at least one embodiment, ganged stage relays 300, 302, 304, 306, 308, 310, 312, 314, 316 are organized into two stages of ganging followed by a final output stage. Ganging and use of electromechanical relays may achieve electrical isolation.

Figure 4:
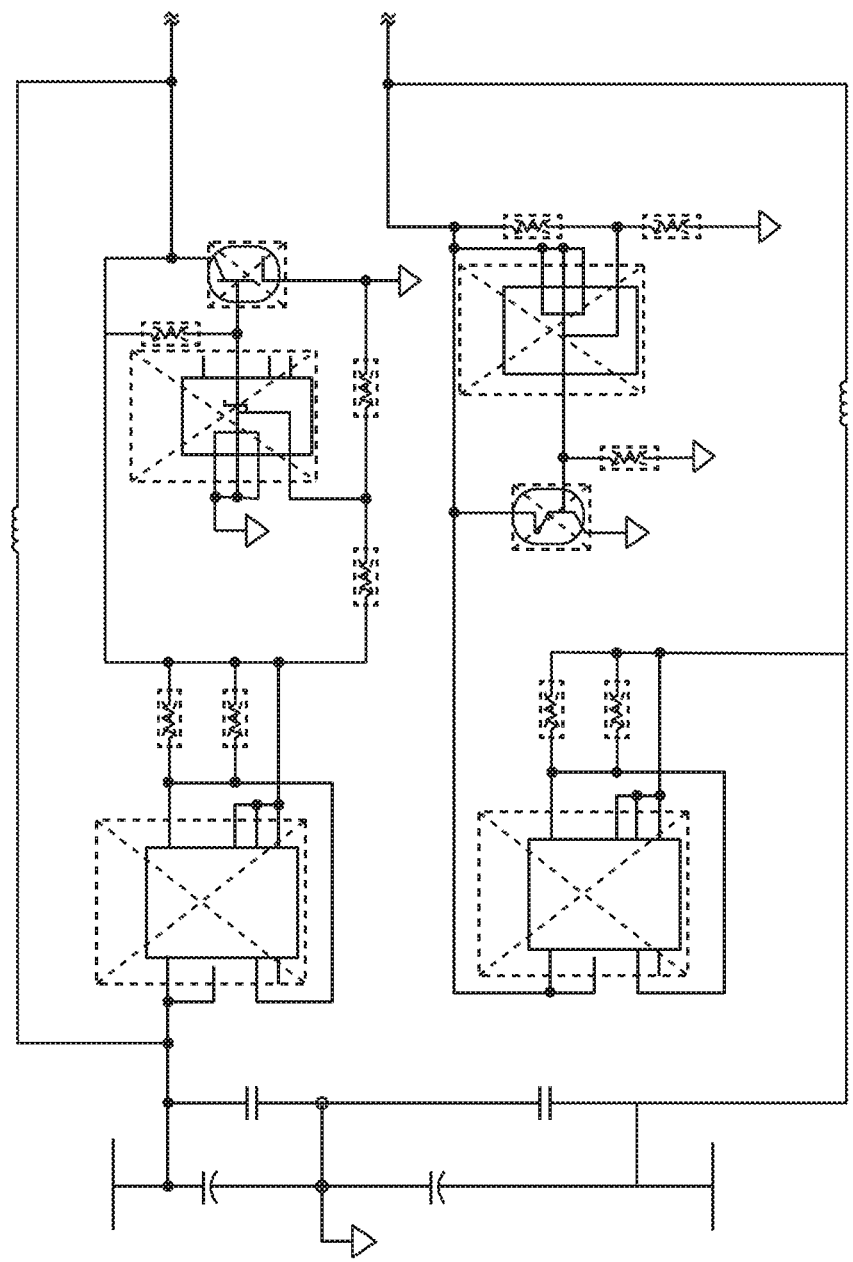
FIG. 4 shows a circuit diagram of a low-pass filter according to an exemplary embodiment.
Figure 4:
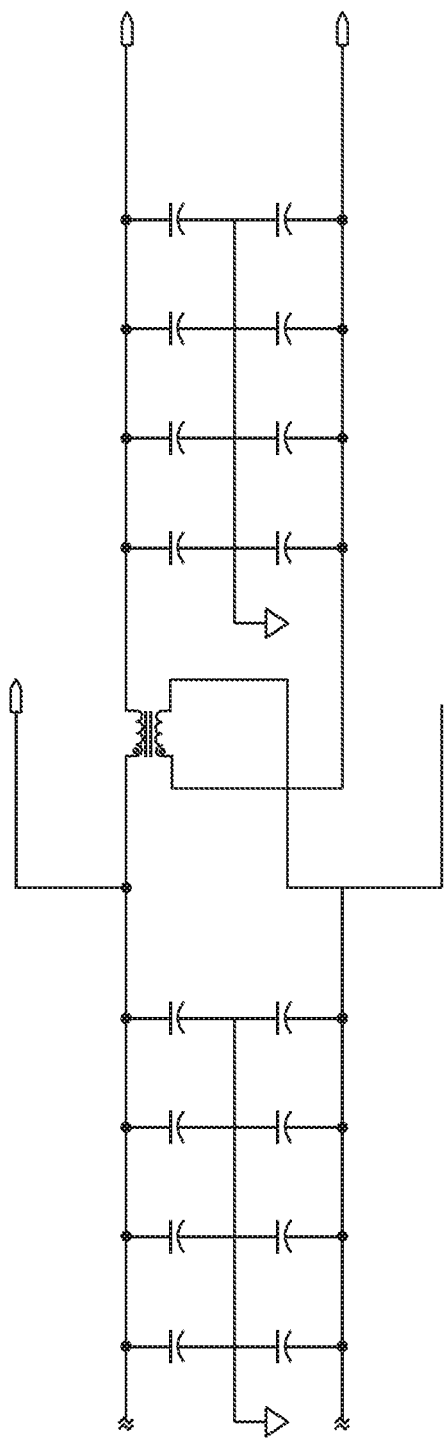

Referring to FIG. 4, a circuit diagram of a low-pass filter according to an exemplary embodiment is shown. In at least one embodiment, the low-pass filter comprises series Z elements of 1.6 mH, that provide at least 10 Ohm series impedance at 1 kHz, and at least 300 Ohm series impedances at 30 kHz. In at least one embodiment, one low-pass filter stage provides greater than 60 dB of electrical isolation for frequencies greater than 30 kHz. L1 acts as High-Z element with series impedance greater than 60 dB for a 0.1 Ohm power source impedance. In at least one embodiment, for frequencies in the range of 30 kHz to 100 kHz, two low-pass filter stages may provide much greater than 100 dB electrical isolation.

Embodiments may be suitable for high-assurance routing in networks of differing security levels; providing electrical isolation in secure deterministic fabrics; and communication systems with multilevel encryption based secure separation.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The form herein before described being merely an explanatory embodiment thereof, it is the intention of the following claims to encompass and include such changes. Furthermore, any of the features disclosed in relation to any of the individual embodiments may be incorporated into any other embodiment.

What is claimed is:

1. A broadband switch comprising:
   a first electromagnetically isolated cavity;
   a second electromagnetically isolated cavity;
   a power input disposed in the first electromagnetically isolated cavity;

a plurality of signal inputs disposed in the second electromagnetically isolated cavity; and
a plurality of analog passive relays, each associated with one or more signal inputs,
wherein:
the plurality of relays are organized as two stages of ganged staged relays and a final output stage;
power interface lines associated with the power input are disposed orthogonal to data input lines associated with the plurality of signal inputs to provide at least 100 dB of electrical isolation;
the broadband switch lacks a common ground plane to prevent ground loops; and
the broadband switch lacks shared return lines to reduce mutual inductance.

2. The broadband switch of claim 1, further comprising a first low-pass filter disposed at the first electromagnetically isolated cavity and a second low-pass filter disposed at the second electromagnetically isolated cavity.

3. The broadband switch of claim 2, wherein the first low-pass filter and second low-pass filter are configured to provide at least 10 Ohm series impedance at 1 kHz, and at least 300 Ohm series impedances at 30 kHz.

4. The broadband switch of claim 2, further comprising one or more feedthrough capacitors disposed between the first low-pass filter and the second low-pass filter.

5. The broadband switch of claim 1, wherein the plurality of relays comprise RF relays.

6. The broadband switch of claim 1, wherein:
the plurality of signal inputs are electrically isolated from each other by at least 65 dB for signals within a range of at least 1 kHz to 100 MHz; and
the plurality of signal inputs are electrically isolated from a signal output by at least 65 dB for signals within a range of at least 1 kHz to 100 MHz.

7. The broadband switch of claim 1, wherein the plurality of signal inputs are electrically isolated from the power input by at least 100 dB for signals within a range of at least 1 kHz to 100 MHz.

8. A broadband data communication system comprising:
a broadband switch comprising:
a first electromagnetically isolated cavity;
a second electromagnetically isolated cavity;
a power input disposed in the first electromagnetically isolated cavity;
a plurality of signal inputs disposed in the second electromagnetically isolated cavity; and
a plurality of analog passive relays,
wherein:
the plurality of relays are organized as two stages of ganged staged relays and a final output stage;
power interface lines associated with the power input are disposed orthogonal to data input lines associated with the plurality of signal inputs to provide at least 100 dB of electrical isolation;
the broadband switch lacks a common ground plane to prevent ground loops; and
the broadband switch lacks shared return lines to reduce mutual inductance.

9. The broadband data communication system of claim 8, further comprising a first low-pass filter disposed at the first electromagnetically isolated cavity and a second low-pass filter disposed at the second electromagnetically isolated cavity.

10. The broadband data communication system of claim 9, further comprising one or more feedthrough capacitors disposed between the first low-pass filter and the second low-pass filter.

11. The broadband data communication system of claim 8, wherein the plurality of relays comprise RF relays.

12. The broadband data communication system of claim 8, wherein:
the plurality of signal inputs are electrically isolated from each other by at least 65 dB for signals within a range of at least 1 kHz to 100 MHz; and
the plurality of signal inputs are electrically isolated from a signal output by at least 65 dB for signals within a range of at least 1 kHz to 100 MHz.

13. The broadband data communication system of claim 8, wherein the plurality of signal inputs are electrically isolated from the power input by at least 100 dB for signals within a range of at least 1 kHz to 100 MHz.

* * * * *